US012660285B2

(12) United States Patent
Hsiao et al.

(10) Patent No.: US 12,660,285 B2
(45) Date of Patent: *Jun. 16, 2026

(54) STRUCTURE FOR METAL GATE ELECTRODE AND METHOD OF FABRICATION

(71) Applicant: Taiwan Semiconductor Manufacturing Co., Ltd., Hsin-Chu (TW)

(72) Inventors: Ru-Shang Hsiao, Jhubei City (TW); Ching-Hwanq Su, Tainan City (TW); Pohan Kung, Hsinchu (TW); Ying Hsin Lu, Hsinchu (TW); I-Shan Huang, Tainan City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 357 days.

This patent is subject to a terminal disclaimer.

(21) Appl. No.: 18/446,567

(22) Filed: Aug. 9, 2023

(65) Prior Publication Data

US 2023/0387230 A1 Nov. 30, 2023

Related U.S. Application Data

(62) Division of application No. 17/700,172, filed on Mar. 21, 2022, now Pat. No. 11,961,891, which is a
(Continued)

(51) Int. Cl.
*H10D 64/27* (2025.01)
*H10D 30/01* (2025.01)
(Continued)

(52) U.S. Cl.
CPC ......... *H10D 64/517* (2025.01); *H10D 30/024* (2025.01); *H10D 30/62* (2025.01);
(Continued)

(58) Field of Classification Search
CPC ... H01L 21/28; H01L 21/28008; H10D 30/01; H10D 30/024; H10D 30/62;
(Continued)

(56) References Cited

U.S. PATENT DOCUMENTS 7,667,271 B2 2/2010 Yu et al.
8,362,575 B2 1/2013 Kwok et al.
(Continued)

FOREIGN PATENT DOCUMENTS

DE 102017117794 A1 6/2018
KR 20160093424 A 8/2016
(Continued)

*Primary Examiner* — Brook Kebede
(74) *Attorney, Agent, or Firm* — HAYNES AND BOONE, LLP

(57) ABSTRACT

A semiconductor device includes a channel component of a transistor and a gate component disposed over the channel component. The gate component includes: a dielectric layer, a first work function metal layer disposed over the dielectric layer, a fill-metal layer disposed over the first work function metal layer, and a second work function metal layer disposed over the fill-metal layer.

20 Claims, 13 Drawing Sheets

Related U.S. Application Data division of application No. 16/692,571, filed on Nov. 22, 2019, now Pat. No. 11,282,934.

(60) Provisional application No. 62/879,235, filed on Jul. 26, 2019.

(51) Int. Cl.

| | |
|---|---|
| *H10D 30/62* | (2025.01) |
| *H10D 64/01* | (2025.01) |
| *H10D 64/66* | (2025.01) |

(52) U.S. Cl.

CPC ......... *H10D 30/6211* (2025.01); *H10D 64/01* (2025.01); *H10D 64/017* (2025.01); *H10D 64/518* (2025.01); *H10D 64/666* (2025.01)

(58) Field of Classification Search

CPC .. H10D 30/6211; H10D 64/517; H10D 64/27; H10D 64/01; H10D 64/017; H10D 64/518; H10D 64/66; H10D 64/666; H10D 64/667; H10D 64/671; H10D 84/01; H10D 84/0172; H10D 84/0193; H10D 84/03; H10D 84/038; H10D 64/512; H10D 84/853; H10D 84/85

See application file for complete search history.

(56) References Cited

U.S. PATENT DOCUMENTS

| | | | |
|---|---|---|---|
| 8,367,498 | B2 | 2/2013 | Chang et al. |
| 8,440,517 | B2 | 5/2013 | Lin et al. |
| 8,497,528 | B2 | 7/2013 | Lee et al. |
| 8,610,240 | B2 | 12/2013 | Lee et al. |
| 8,680,576 | B2 | 3/2014 | Ching et al. |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,785,285 | B2 | 7/2014 | Tsai et al. |
| 8,796,759 | B2 | 8/2014 | Perng et al. |
| 8,809,139 | B2 | 8/2014 | Huang et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 9,590,065 | B2 | 3/2017 | Lee et al. |
| 11,961,891 | B2 * | 4/2024 | Hsiao ................... H10D 64/518 |
| 2011/0068407 | A1 | 3/2011 | Chieh et al. |
| 2011/0248348 | A1 | 10/2011 | Gan |
| 2013/0011983 | A1 | 1/2013 | Yin et al. |
| 2013/0026637 | A1 | 1/2013 | Huo et al. |
| 2014/0203333 | A1 | 7/2014 | Huang et al. |
| 2014/0252412 | A1 | 9/2014 | Hsiang et al. |
| 2016/0049399 | A1 | 2/2016 | Park et al. |
| 2016/0225867 | A1 | 8/2016 | Kim |
| 2016/0365449 | A1 | 12/2016 | Chang et al. |
| 2017/0186846 | A1 | 6/2017 | Badaroglu et al. |
| 2017/0229461 | A1 | 8/2017 | Liao et al. |
| 2018/0082908 | A1 * | 3/2018 | Yeh ........................ H10D 84/85 |
| 2019/0139759 | A1 * | 5/2019 | Cheng ............... H01L 21/28211 |
| 2019/0214478 | A1 | 7/2019 | Kim et al. |
| 2019/0326284 | A1 | 10/2019 | Kim et al. |
| 2020/0119150 | A1 | 4/2020 | Lee et al. |
| 2020/0127089 | A1 * | 4/2020 | Hsu ................... H01L 23/53266 |

FOREIGN PATENT DOCUMENTS

| | | | |
|---|---|---|---|
| KR | 20170094742 | A | 8/2017 |
| KR | 20190076251 | A | 7/2019 |
| TW | 201839815 | A | 11/2018 |

* cited by examiner

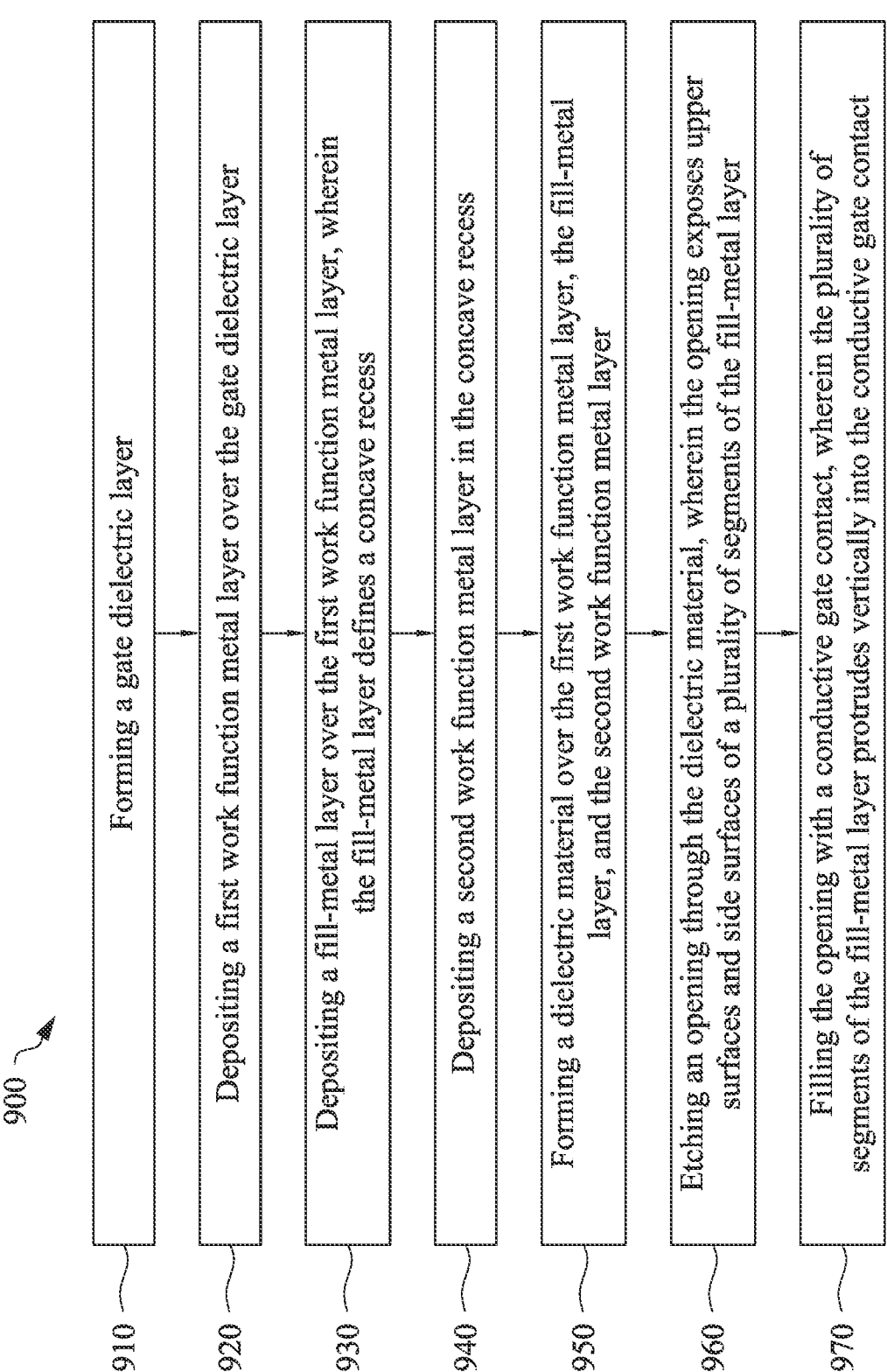

Forming a gate dielectric layer

Depositing a first work function metal layer over the gate dielectric layer

Depositing a fill-metal layer over the first work function metal layer, wherein the fill-metal layer defines a concave recess Depositing a second work function metal layer in the concave recess Forming a dielectric material over the first work function metal layer, the fill-metal layer, and the second work function metal layer Etching an opening through the dielectric material, wherein the opening exposes upper surfaces and side surfaces of a plurality of segments of the fill-metal layer Filling the opening with a conductive gate contact, wherein the plurality of segments of the fill-metal layer protrudes vertically into the conductive gate contact

STRUCTURE FOR METAL GATE ELECTRODE AND METHOD OF FABRICATION

PRIORITY DATA

The present application is a divisional U.S. patent application of U.S. patent application Ser. No. 17/700,172, filed on Mar. 21, 2022, entitled "Novel Structure For Metal Gate Electrode And Method of Fabrication", which is a divisional U.S. patent application of U.S. patent application Ser. No. 16/692,571, filed on Nov. 22, 2019, entitled "Novel Structure For Metal Gate Electrode And Method of Fabrication", which is a utility application of U.S. provisional patent application 62/879,235, filed on Jul. 26, 2019, and entitled "Novel Structure For Metal Gate Electrode And Method of Fabrication", the content of each which is hereby incorporated by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the device scaling down process continues, electrical resistance may become a greater concern. In conventional IC devices, it may be difficult to reduce the gate contact resistance. As such, the performance for conventional IC devices has not been optimized.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 18 is a flowchart of a method of fabricating a semiconductor device according to various aspects of the present disclosure.

DETAILED DESCRIPTION

Figure 1:
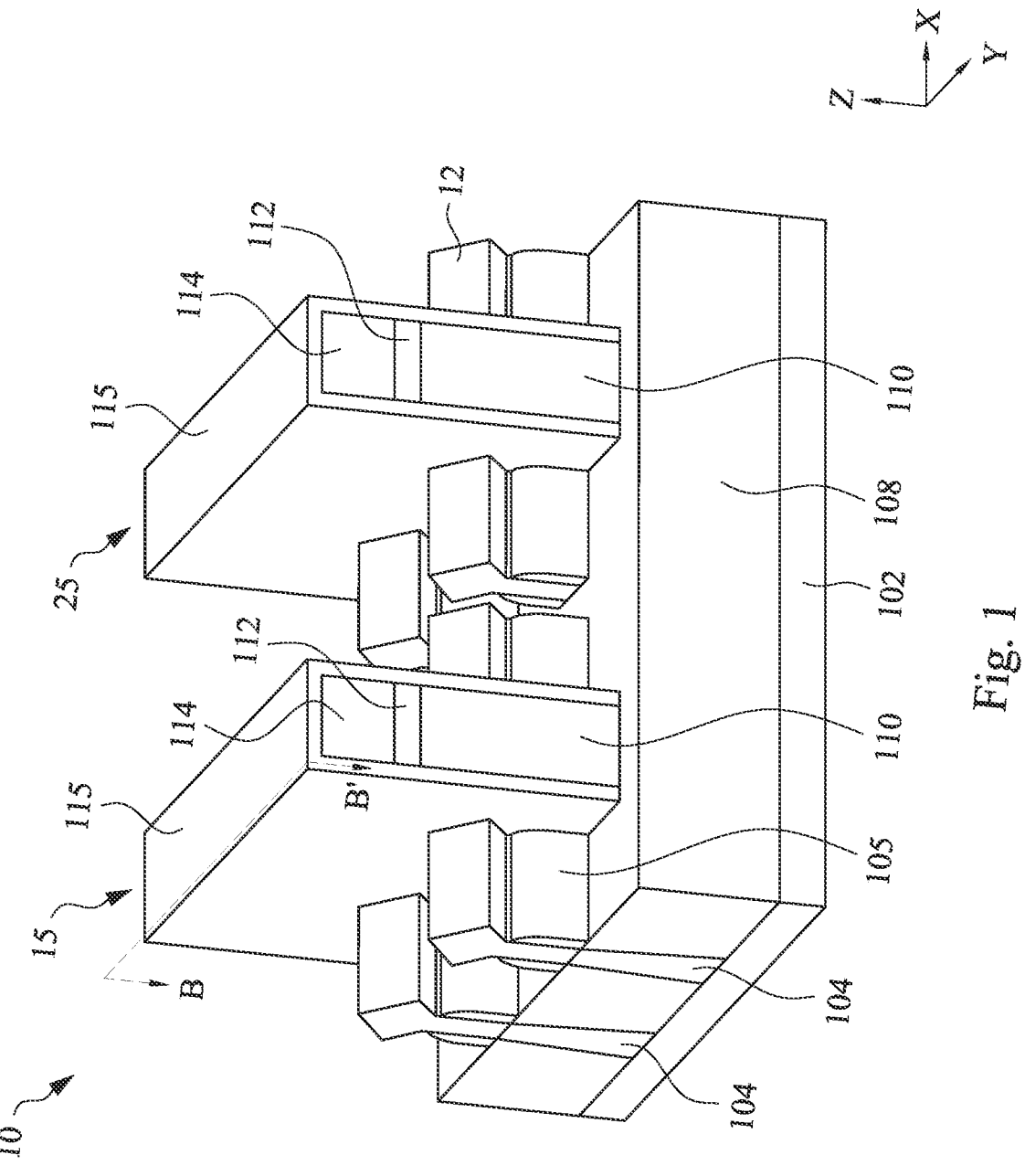
FIG. 1 is a perspective view of a FinFET device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Certain aspects of the present disclosure are generally related to semiconductor devices, and more particularly to field-effect transistors (FETs), such as planar FETs or three-dimensional fin-line FETs (FinFETs). One embodiment of the present disclosure is illustrated below using a FinFET as an example, though it is understood that the present disclosure applies to non-FinFET planar devices too, unless specifically claimed otherwise.

Referring to FIG. 1, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a multiple patterning lithography process, such as a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. One or more dielectric layers 115 may also be formed on the sidewalls of the gate electrode 110 and over the hard mask layers 112 and 114. In at least one embodiment, the dielectric layers 115 may be directly in contact with the gate electrode 110. The one or more dielectric layers 115 may be patterned to form gate spacers.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

Figure 2:
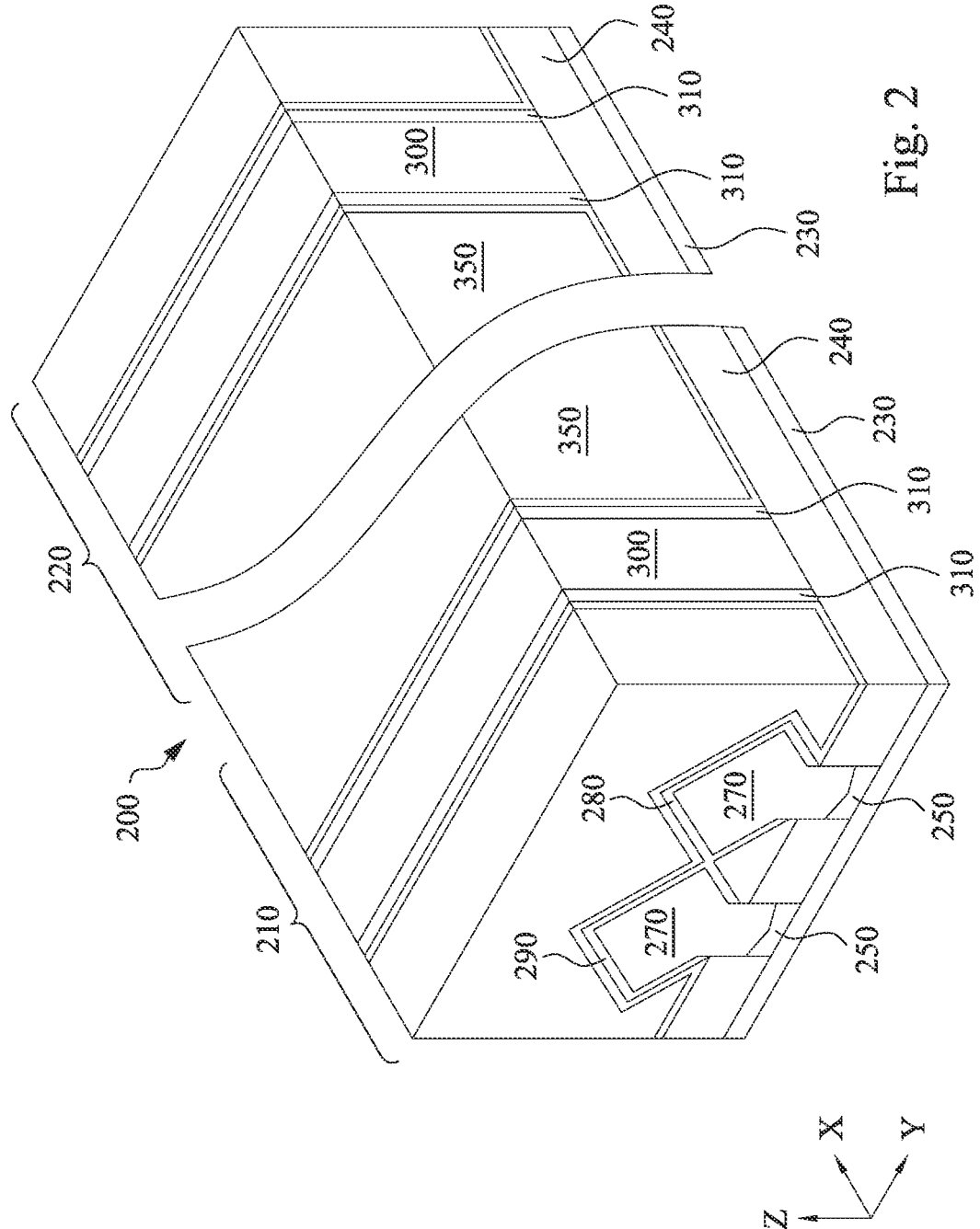
FIGS. 2-4 are diagrammatic three-dimensional perspective views of a portion of a semiconductor device at various stages of fabrication according to various aspects of the present disclosure.
Figure 3:
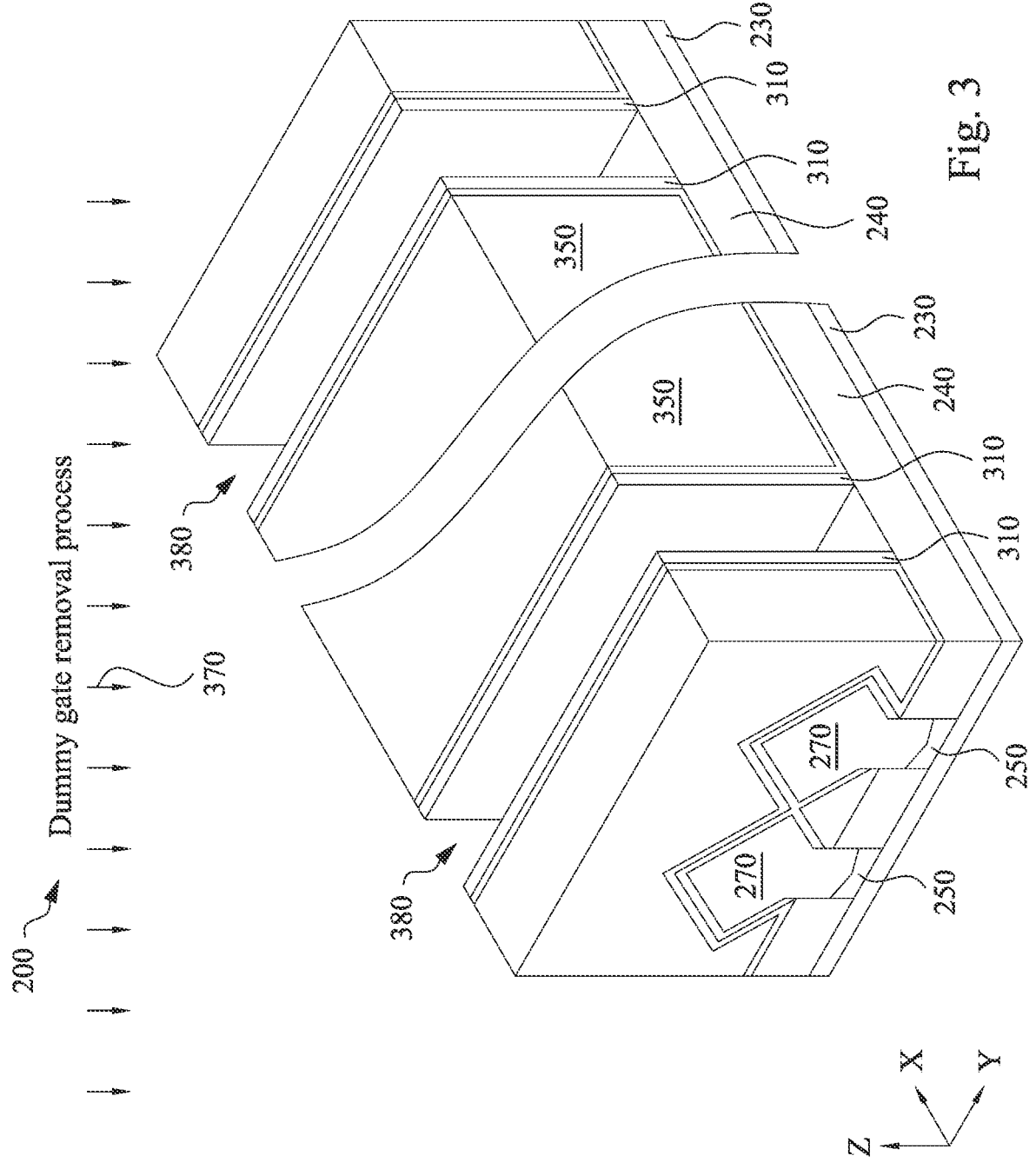
Figure 4:
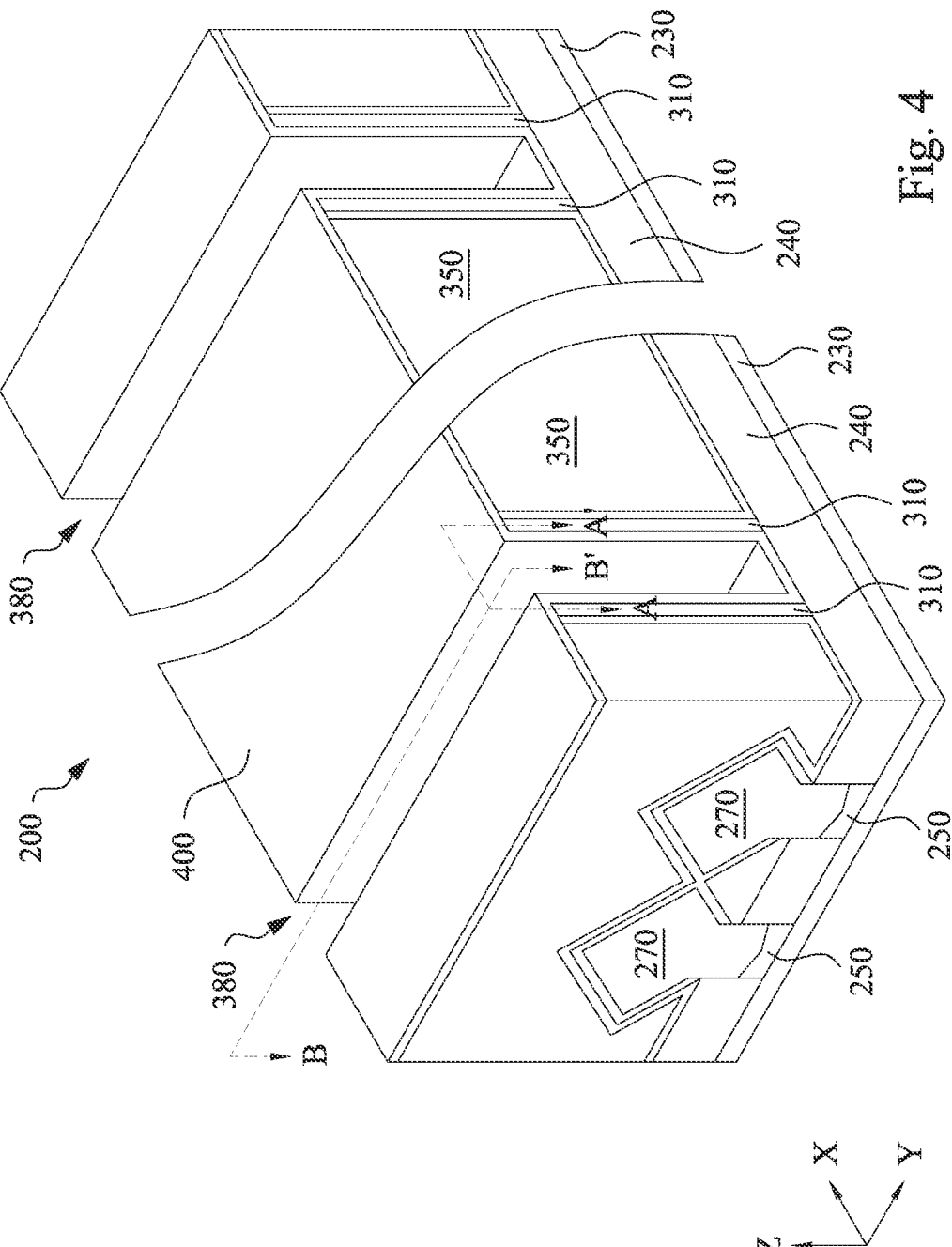

FIGS. 2-4 are diagrammatic fragmentary three-dimensional perspective views of a portion of a semiconductor device 200 at various stages of fabrication. In some embodiments, the semiconductor device 200 may be implemented as a FinFET device such as the FinFET device 10 discussed above with reference to FIG. 1. Referring to FIG. 2, the semiconductor device 200 may include a PMOS region 210 and an NMOS region 220 located away from the PMOS region 210. Both the PMOS region 210 and the NMOS region 220 are formed over a substrate 230, which may be an embodiment of the substrate 102 of FIG. 1. In some embodiments, the substrate 230 includes a silicon substrate. Both the PMOS region 210 and the NMOS region 220 also include an isolation structure 240 formed over the substrate 230. The isolation structure 240 may be an embodiment of the isolation structure 108 of FIG. 1. In some embodiments, the isolation structure 240 may include a shallow trench isolation (STI).

Fin structures 250 may protrude vertically upward in the Z-direction from the substrate 230. The fin structures 250 may be an embodiment of the fin structures 104 of FIG. 1. In some embodiments, the fin structures 250 may include a silicon material. Epi-layers 270 are grown on the fin structures 250. The epi-layers 270 may be embodiments of the epi-layers 12 of FIG. 1. In some embodiments, the epi-layers 270 in the PMOS region 210 may include SiGe, whereas the epi-layers in the NMOS region 220 may include Si. Layers 280 and 290 may also be formed over the epi-layers 270. As non-limiting examples, the layers 280 and 290 may includer layers such as silicide layers, etching-stop layers, passivation layers, etc.

Dummy gate structures 300 are formed to wrap around the fin structures 250, for example in a manner similar to how the gate electrode 110 wraps around the fin structures 104. The dummy gate structures 300 may include a dummy gate electrode, for example a polysilicon gate electrode. Gate spacers 310 are formed on sidewalls of each of the dummy gate structures 300. In some embodiments, the gate spacers 310 may include one or more dielectric materials, for example silicon nitride, silicon carbon nitride (SiCN), silicon carbon oxynitride (SiCON), or a suitable low-k dielectric material. An interlayer dielectric (ILD) 350 is formed over the isolation structure 240. In some embodiments, the ILD 350 contains a low-k dielectric material, for example a dielectric material having a dielectric constant less than about 4. Portions of the ILD 350 are disposed between the dummy gate structures 300 (or provide electrical isolation between them).

Referring now to FIG. 3, a dummy gate removal process 370 is performed to the semiconductor device 200 to remove the dummy gate structures 300. In some embodiments, the dummy gate removal process 370 includes one or more etching processes that are configured to have etching selectivity between the dummy gate structures 300 and other components of the semiconductor device 200. For example, the one or more etching processes may be configured to have a substantially greater etching rate for polysilicon than other materials, so that the polysilicon material of the dummy gate structures 300 may be removed without substantially removing other components of the semiconductor device 200. As a result of the performance of the dummy gate removal process 370, openings 380 are formed in place of the removed dummy gate structures 300.

Referring now to FIG. 4, one or more layers 400 are formed over the ILD 350 and in the openings 380. The one or more layers 400 may be formed by one or more deposition processes such as CVD, PVD, ALD, HDPCVD, MOCVD, RPCVD, PECVD, or combinations thereof. In some embodiments, the one or more layers 400 may include an interfacial layer (IL) and a gate dielectric layer formed over the IL. In some embodiments, the IL may include silicon oxide, and the gate dielectric layer may include a high-k dielectric material (e.g., a material with a dielectric constant greater than about 4). In other embodiments, the IL or the gate dielectric layer may include an oxide material containing Si, Hf, Zr, Pb, Sb, or La, or a nitride material containing Si, Hf, Zr, Pb, Sb, or La.

FIGS. 5-15 and 17 are diagrammatic fragmentary cross-sectional side view of a portion of the semiconductor device 200 along an X-Z plane, so as to illustrate the various process steps performed to form a gate electrode according to various aspects of the present disclosure. In some embodiments, the cross-sectional cut is taken corresponding to the location of a cutline A-A' shown in FIG. 4, which is aligned with a channel region of the transistor of the semiconductor device 200. Since the cutline A-A' extends in the X-direction, FIGS. 5-15 and 17 may also be referred to as X-cut views. For reasons of consistency and clarity, component that are similar to those appearing in FIG. 4 are labeled the same in FIGS. 5-15 and 17. It is also understood that, for reasons of simplicity FIGS. and 17 illustrate the processing steps of forming a gate structure of a PMOS transistor. However, the processing steps for forming a gate structure of an NMOS transistor may be substantially similar, except that where a p-type metal is formed in the PMOS transistor, an n-type metal is formed in the NMOS transistor, or vice versa, as discussed in more detailed below.

Figure 5:
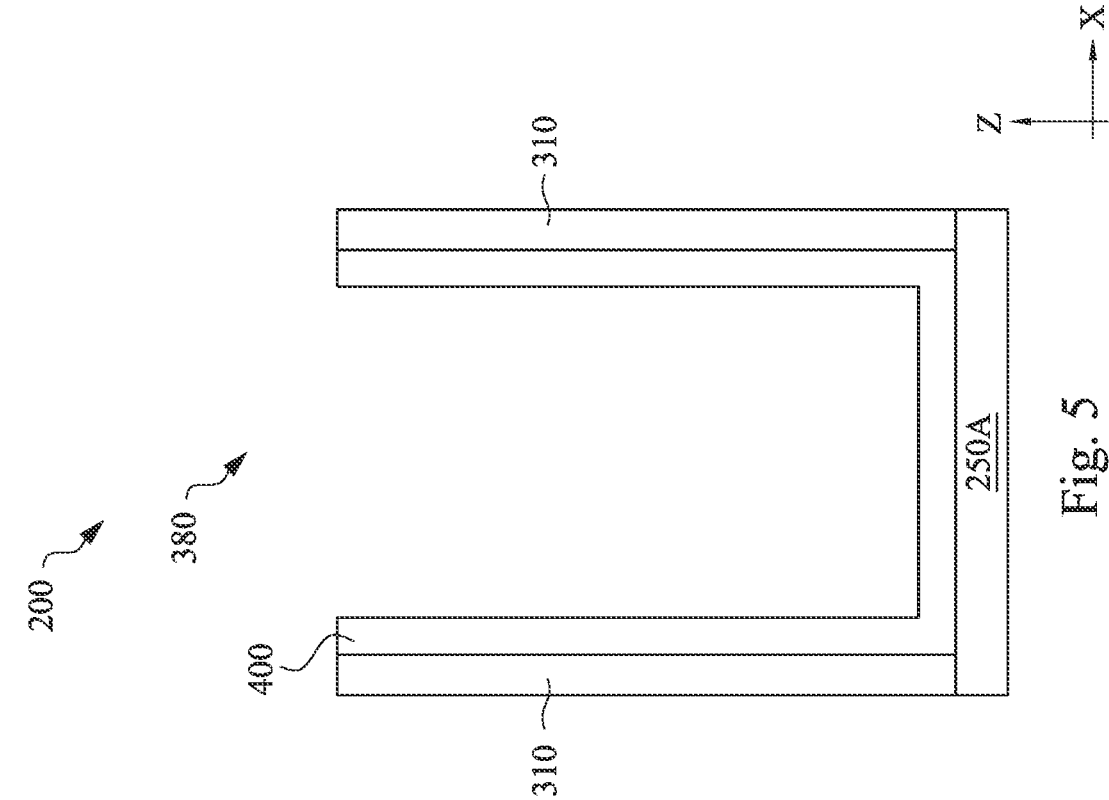

At the stage of fabrication shown in FIG. 5, the one or more layers 400 are formed in the opening 380. The side portions of the one or more layers 400 are formed on the sidewalls of the gate spacers 310. The bottom portion of the one or more layers 400 is formed over the isolation structure 240 and over a channel region 250A (e.g., a portion of the fin structure 250). Since the X-cut of FIG. 5 is taken at the channel region 250A, FIG. 5 shows the bottom portion of the one or more layers 400 as being formed over the channel region 250A. Had the X-cut of FIG. 5 been taken at the isolation structure 240, FIG. 5 would have shown the bottom portion of the one or more layers 400 disposed over the isolation structure 240.

Figure 6:
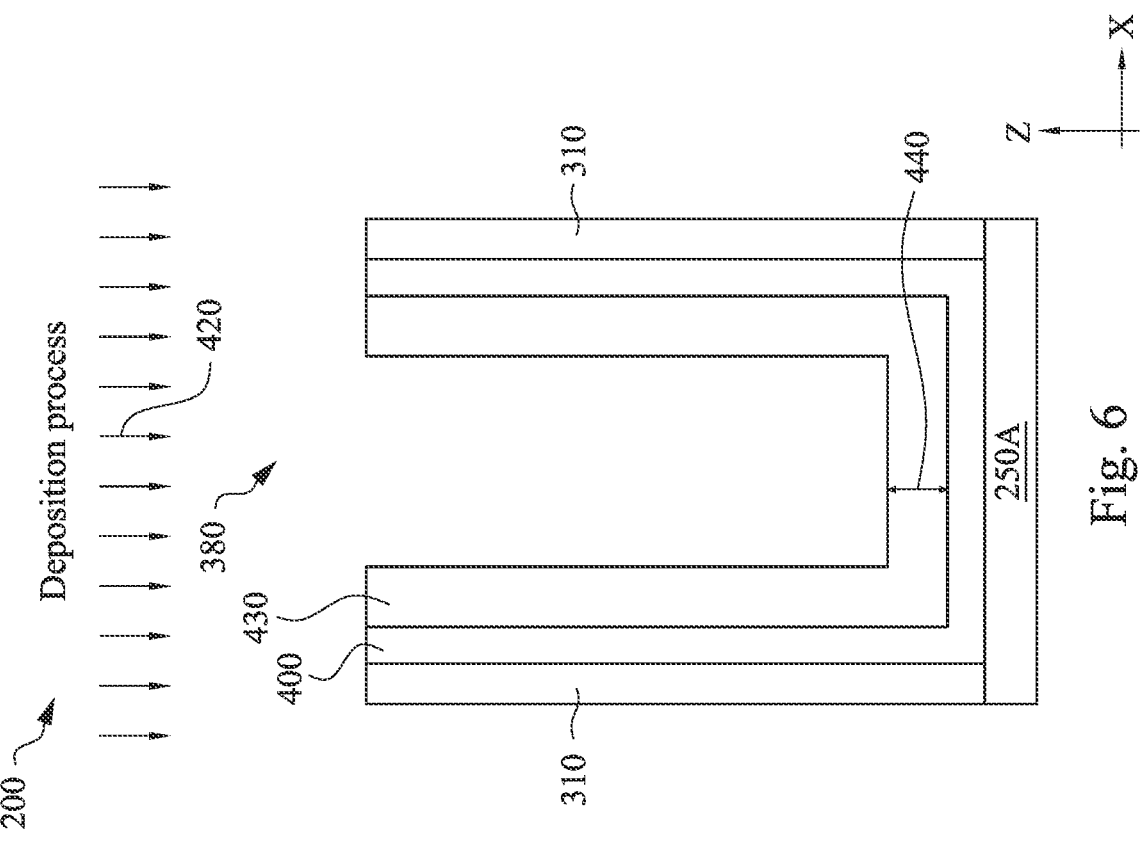
FIGS. 5-17 are diagrammatic cross-sectional side views of a portion of a semiconductor device at various stages of fabrication according to various aspects of the present disclosure.

Referring now to FIG. 6, a deposition process 420 is performed to form a metal layer 430 over the one or more layers 400 in the opening 380. The metal layer 430 may be a p-type work function metal that is used to tune a threshold voltage (Vt) of a metal gate electrode. In some embodiments, the metal layer 430 includes TiN. In other embodiments, the metal layer 430 may include a nitride material of Ti, Ta, Cr, Ni, Mo, Cu, Zr, Zn, Fe, or Sn, or an oxide material of Ti, Ta, Cr, Ni, Mo, Cu, Zr, Zn, Fe, and/or Sn. The process parameters of the deposition process 420 are also configured to control a thickness 440 of the deposited metal layer 430. In some embodiments, the thickness 440 is in a range between about 0 angstroms and about 30 angstroms. Such a thickness range allows the metal layer 430 to sufficiently tune the threshold voltage, without occupying too much room/space of the gate electrode.

Figure 7:
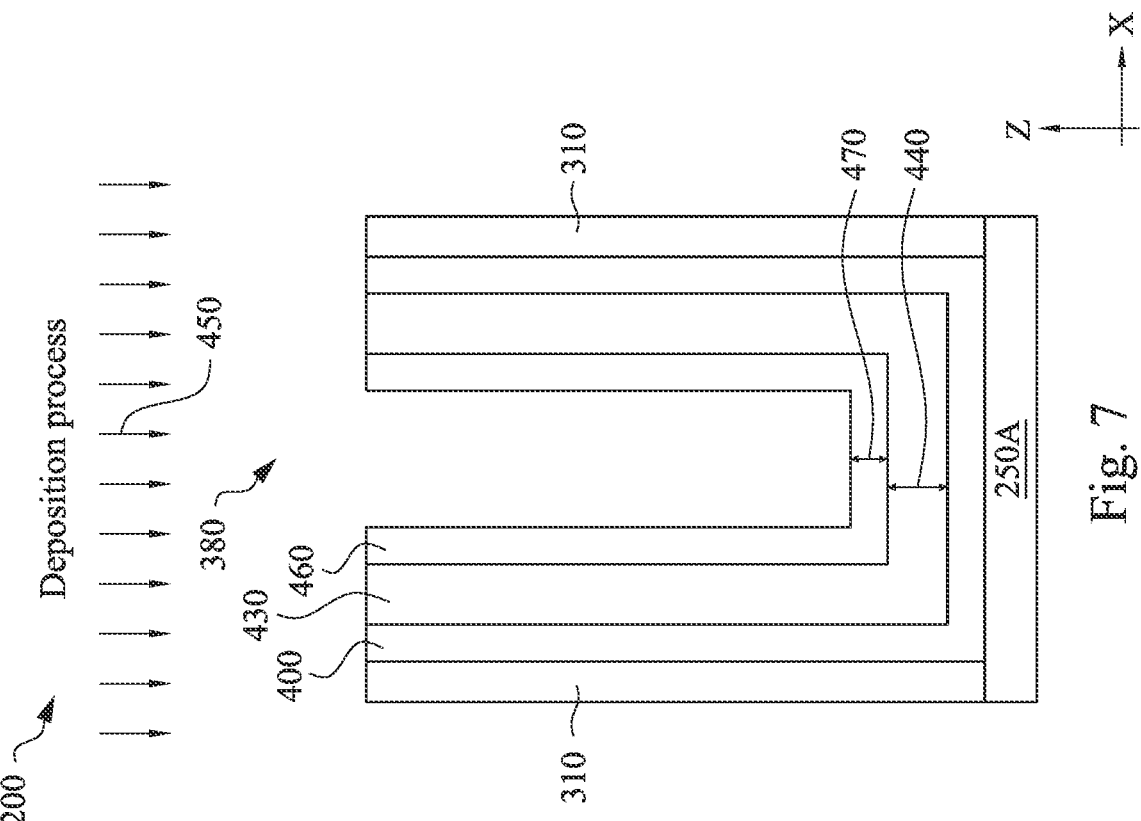

Referring now to FIG. 7, a deposition process 450 is performed to form a metal layer 460 (also referred to as a fill-metal) over the metal layer 430 in the opening 380. The metal layer 460 may include a metal material and will serve as a main conductive portion of the metal gate electrode. In some embodiments, the metal layer 460 includes W. In other embodiments, the metal layer 460 may include Cu, Co, or Al. The process parameters of the deposition process 450 are also configured to control a thickness 470 of the deposited metal layer 460. For example, since the metal layer 460 will serve as the main conductive portion of the metal gate electrode, the thickness 470 is configured to be substantially greater (e.g., at least multiple times greater) than the thickness 440 of the metal layer 460. In some embodiments, the thickness 470 is in a range between about 50 angstroms and about 300 angstroms. Such a thickness range allows the metal layer 460 to sufficiently serve as the main conductive portion of the gate electrode, and it yet still saves some space for the formation of other work function metal layers.

Note that the metal layer 460 has a concave cross-sectional profile. In some embodiments, the concave cross-sectional profile may resemble the letter "U". Such a "U-shaped" cross-sectional profile is achieved as a result of the fill-metal layer 460 not being formed to completely fill the opening 380. For example, a bottom portion of the fill-metal layer 460 is formed over the upper surface of the metal layer 430, and side portions of the fill-metal layer 460 are formed on sidewalls of the metal layer 430, and the opening 380 is located between the side portions of the fill-metal layer 460. A concave recess is therefore defined by the bottom portion and the side portions of the metal layer 460.

This "U-shaped" cross-sectional profile of the fill-metal layer 460 is different from conventional fill-metal layers of a gate electrode due to the unique fabrication processing flow of the present disclosure. For example, in conventional semiconductor devices, a fill-metal layer does not define a concave recess, but rather may exhibit an "I"-like cross-sectional profile, and no additional work function metal layers may be formed over the fill-metal layer in conventional devices. Compared to conventional devices, the "U"-like cross-sectional profile of the fill-metal layer 460 reduces contact resistance, because the "U-shape" effectively allows for a greater surface contact area with a conductive gate contact to be formed over the side portions of the fill-metal layer 460. In other words, whereas the "I"-shaped profile of conventional devices allows a single protruding member of the fill-metal layer to be in contact with the gate contact, the "U-shaped" profile of the fill-metal layer 460 herein allows multiple (e.g., two) protruding members to be in contact with the gate contact, which effectively increases the surface contact area and therefore reduces gate contact resistance.

In addition, the fill-metal layer 460 herein has improved gap-filling performance compared to conventional devices, since the gap that it is filling—the opening 380—is wider during this stage of fabrication shown in FIG. 7 that it would have been under conventional fabrication processing flow. Stated differently, the fill-metal is formed as a last step in conventional devices, as all the work function metal layers have already been formed prior to the deposition of the fill-metal. As such, the fill-metal would have to fill a relatively small/narrow opening, which places stringent requirements on the gap-filling performance of the fill-metal. In comparison, the fill-metal layer 460 herein is formed as an intermediate step and before the deposition of some of the work function metals. As such, the demands for gap-filling are not as strict on the fill-metal layer 460, since the opening 380 is still relatively wide at this stage of fabrication.

Figure 8:
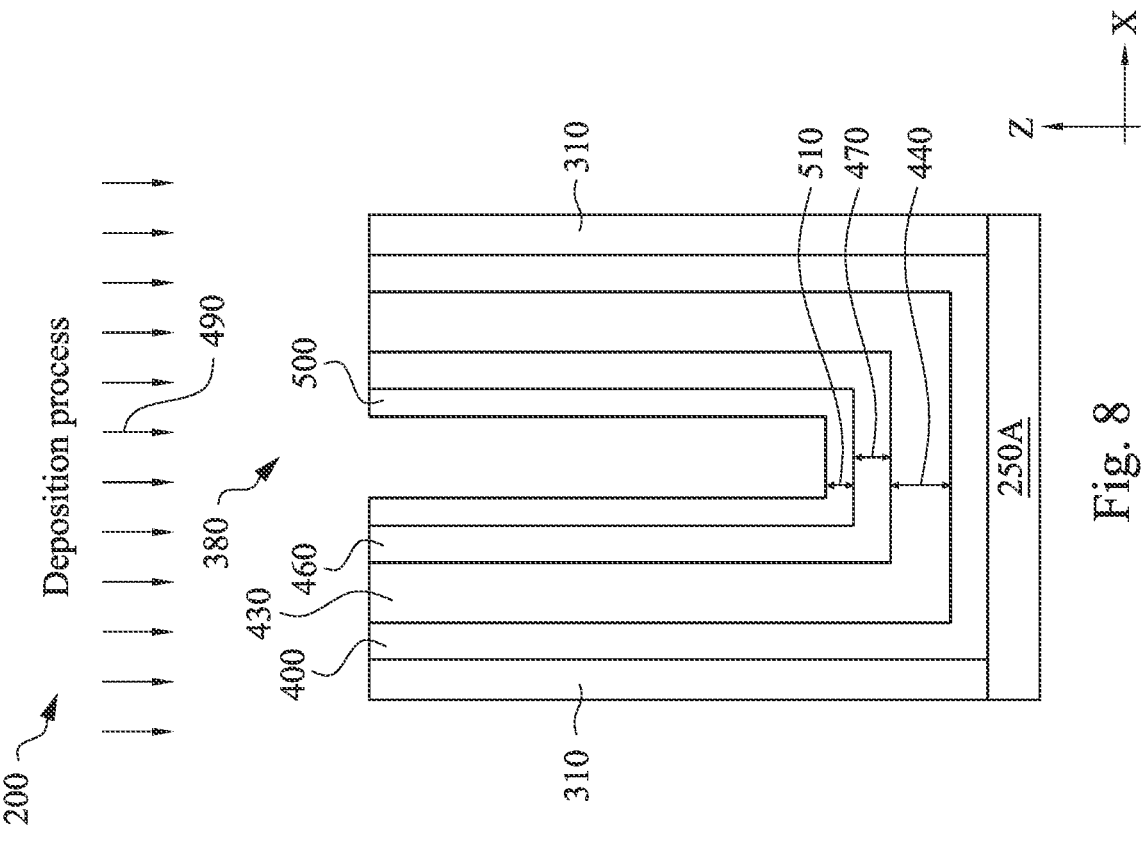

Referring now to FIG. 8, a deposition process 490 is performed to form a metal layer 500 over the metal layer 460 in the opening 380. The metal layer 500 may be another p-type work function metal that is used to tune a threshold voltage (Vt) of the metal gate electrode. In some embodiments, the metal layer 500 includes TiN. In other embodiments, the metal layer 500 may include a nitride material of Ti, Ta, Cr, Ni, Mo, Cu, Zr, Zn, Fe, or Sn, or an oxide material of Ti, Ta, Cr, Ni, Mo, Cu, Zr, Zn, Fe, and/or Sn. The process parameters of the deposition process 490 are also configured to control a thickness 510 of the deposited metal layer 500. In some embodiments, the thickness 510 is in a range between about 0 angstroms and about 30 angstroms. In some embodiments, a ratio between the thickness 440, the thickness 470, and the thickness 510 is in a range between about 0:1:0 and about 1:10:1. Such a thickness range of the metal layer 500 and the ratio range of the thicknesses 440/470/510 is configured to allow the metal layers 430 and 500 to sufficiently tune the threshold voltage, without occupying too much room/space of the gate electrode.

Figure 9:
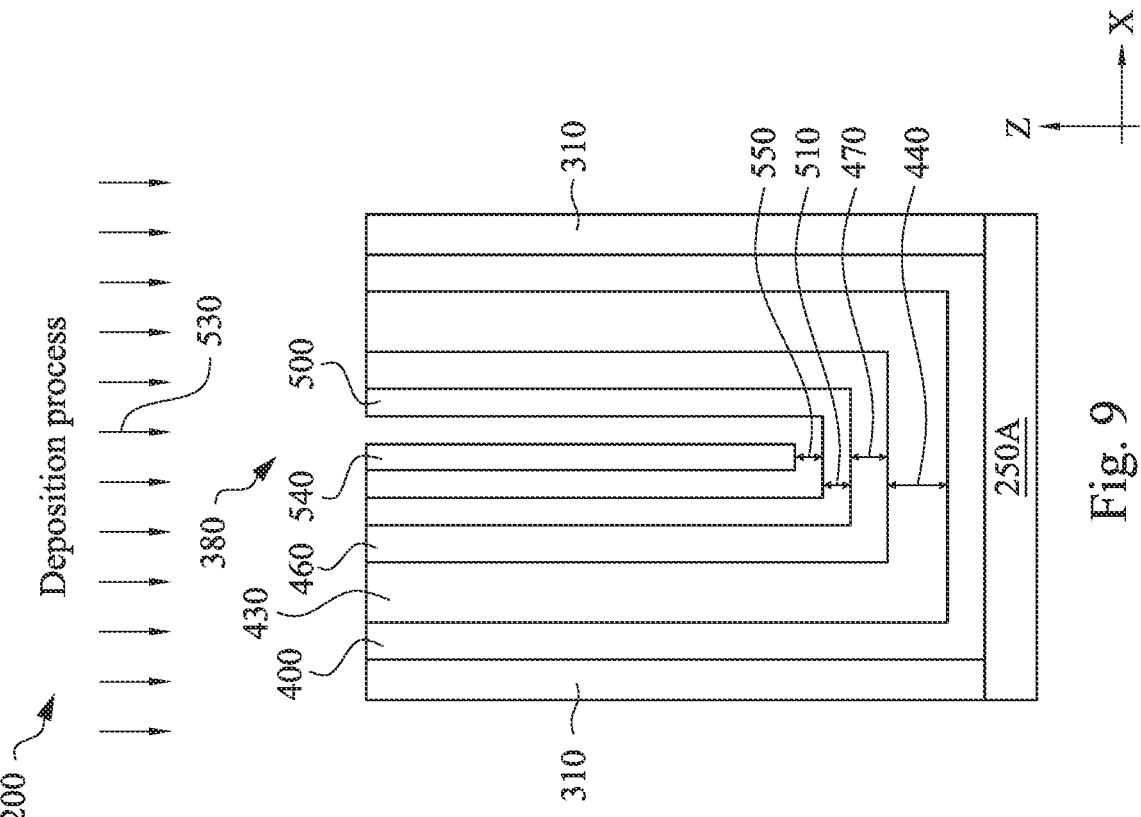

Referring now to FIG. 9, a deposition process 530 is performed to form a metal layer 540 over the metal layer 500 in the opening 380. The metal layer 540 may be an n-type work function metal that is used to tune a threshold voltage (Vt) of the metal gate electrode. In some embodiments, the metal layer 540 includes TiAl. In other embodiments, the metal layer 540 may include an alloy material made of Ti, Al, Ta, Zr, and/or Zn. The process parameters of the deposition process 530 are also configured to control a thickness 550 of the deposited metal layer 540. In some embodiments, the thickness 550 is in a range between about 0 angstroms and about 30 angstroms. Such a thickness range allows the metal layer 540 to sufficiently tune the threshold voltage, without occupying too much room/space of the gate electrode. It is understood that the formation of the metal layer 540 is optional in some embodiments, meaning that it may be omitted without substantially impacting the performance of the semiconductor device 200.

Figure 10:
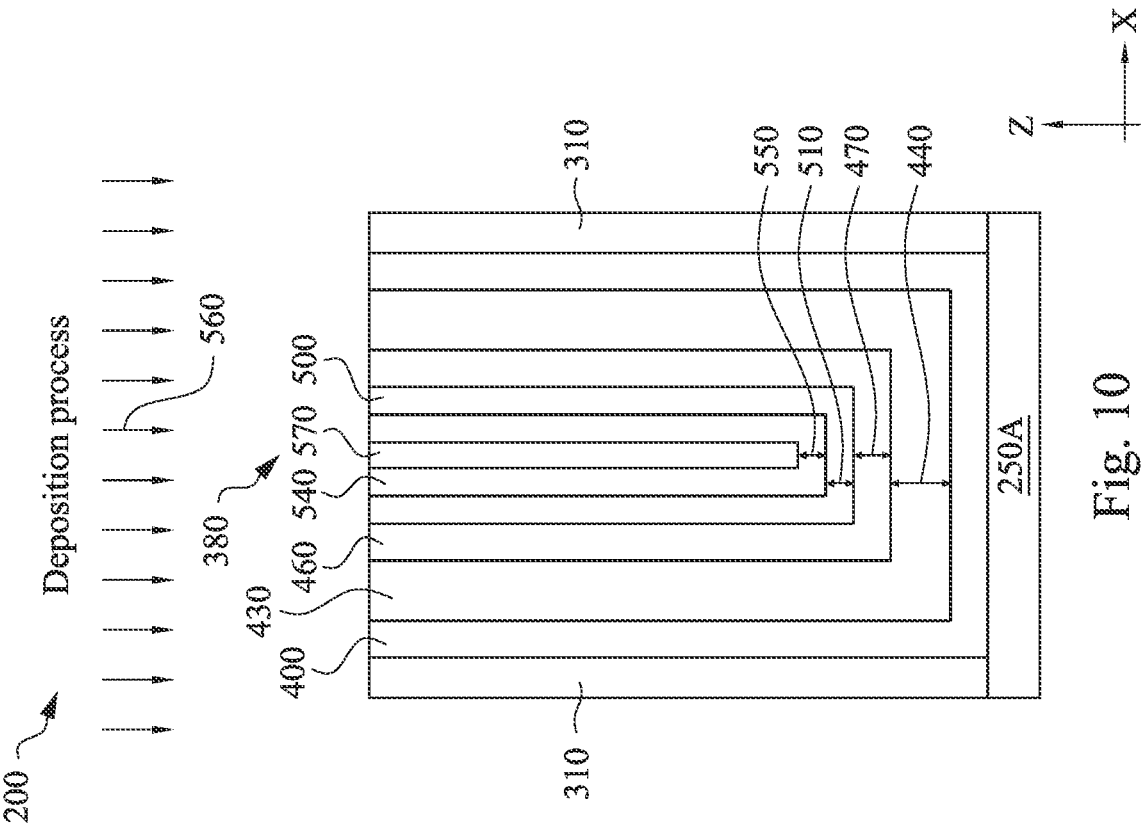

Referring now to FIG. 10, a deposition process 560 is performed to form a metal layer 570 over the metal layer 540 in the opening 380. The metal layer 570 may be another p-type work function metal that is used to tune a threshold voltage (Vt) of the metal gate electrode. In some embodiments, the metal layer 570 includes TiN. In other embodiments, the metal layer 570 may include a nitride material of Ti, Ta, Cr, Ni, Mo, Cu, Zr, Zn, Fe, or Sn, or an oxide material of Ti, Ta, Cr, Ni, Mo, Cu, Zr, Zn, Fe, and/or Sn. The metal layer 570 may substantially fill the opening 380. It is understood that one or more planarization processes (e.g., chemical mechanical polishing (CMP)) processes may be formed to the semiconductor device 200 to planarize or flatten the upper surfaces of the various layers 400, 430, 460, 500, 540, and 570.

In the embodiment discussed above, one p-type work function metal layer (e.g., the metal layer 430 is formed before the fill-metal layer 460, and two other p-type work function metal layers (e.g., the metal layers 500 and 570) and an n-type work function metal layer (e.g., the metal layer 540) is formed after the fill-metal layer 460. However, this is merely a non-limiting example. In other embodiments, other configurations may be employed. For example, two p-type work function metal layers (instead of one) may be formed before the fill-metal layer 460. As another example, the fill-metal layer 460 may be formed before all work function metal layers. As yet another example, multiple fill-metal layers may be formed, with one or more work function metal layers formed in between the multiple fill-metal layers. The material compositions of the work function metal layers (even if they are the same type, e.g., all p-type metal layers) may also be configured to be different from one another. Advantageously, these different types of configurations allow the threshold voltage to be flexibly tuned, since the threshold voltage may vary as a function of either the material composition of the work function metal layer(s) or the distance of the work function metal layer(s) from the channel.

It is also understood that although the embodiment discussed above illustrates the formation of a gate structure of a PMOS, similar processing steps may be performed to form the gate structure of an NMOS, but with the type of work function metal layers flipped. For example, whereas the work function metal layers 430, 500, and 570 are p-type work function metal layers for a PMOS, they may be n-type work function metal layers for an NMOS.

Figures 11, 12:
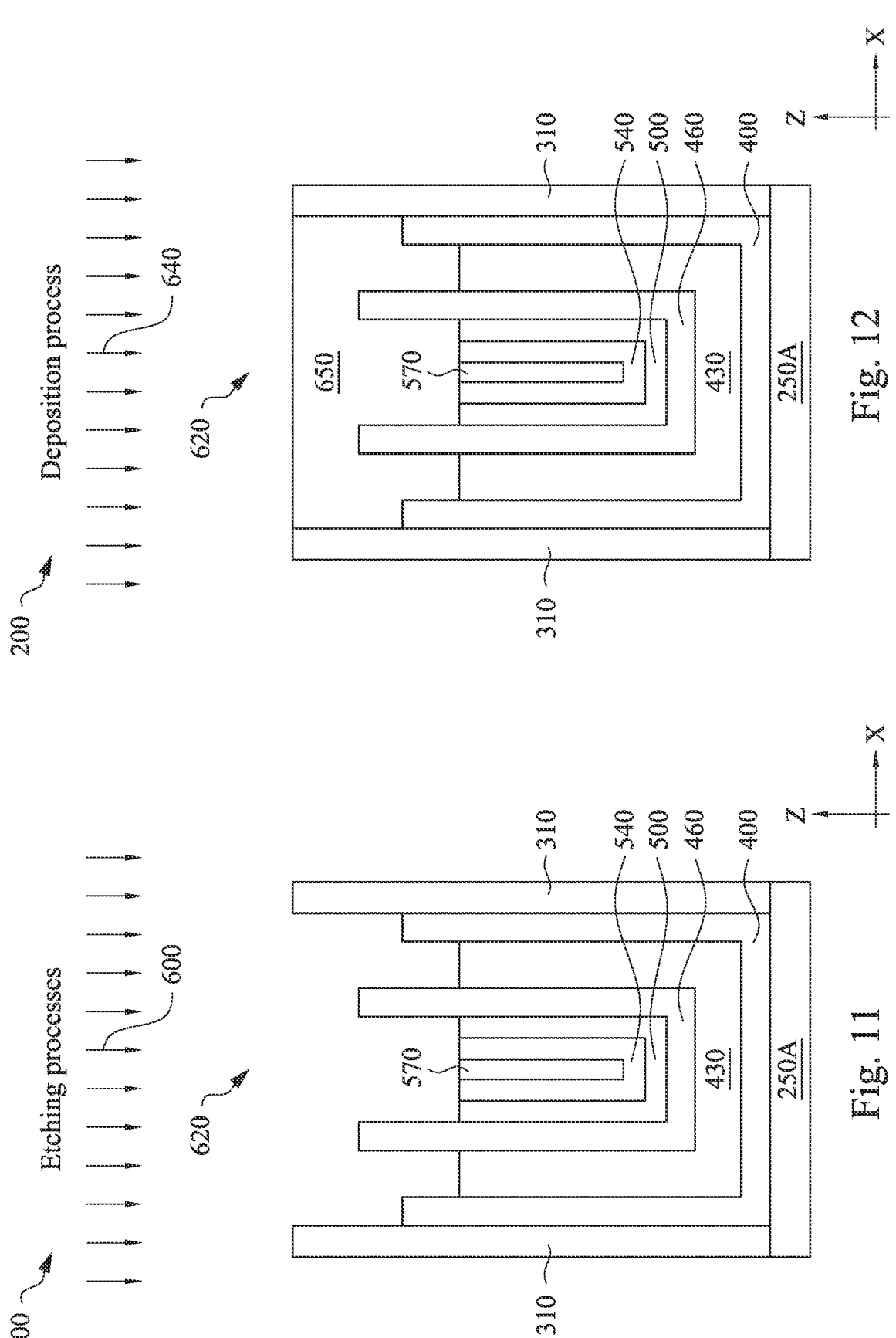

Referring now to FIG. 11, one or more etching processes 600 are performed to the semiconductor device 200. The one or more etching processes 600 may include etching-back processes, where etching selectivity may exist between the gate spacer 310, the one or more layers 400, and the metal layers 430, 460, 500, 540, and 570. For example, the metal layers 430, 500, and 540 may have a substantially greater etching rate than the one or more layers 400, the fill-metal layer 460, and the gate spacers 310. In some embodiments, the etching rate is the slowest for the gate spacers 310, the etching rate of the metal layer 460 is greater than the etching rate of the gate spacers 310, the etching rate of the one or more layers 400 is greater than the etching rate of the metal layer 460, and the etching rate of the metal layers 430, 500, 540, and 570 is greater than the etching rate of the one or more layers 400. As a result of the different etching rates, the various layers at this stage of fabrication have different heights, for example the fill-metal layer 460 has substantially greater heights than the metal layers 430, 500, 540, and 570. This will be discussed in more detail below with reference to FIG. 15. Also as a result of the one or more etching processes 600, an opening 620 is formed. The one or more layers 400 may serve as the gate dielectric (and optionally the IL) of the gate structure, and the metal layers 430, 460, 500, 540, and 570 may collectively serve as the metal gate electrode of the gate structure.

Referring now to FIG. 12, a deposition process 640 is performed to the semiconductor device 200 to fill the opening 620 with a layer 650. The layer 650 may also be referred to as a self-aligned contact (SAC) layer. In some embodiments, the layer 650 includes a dielectric material such as SiN, silicon carbide (SiC), SiOCN, or a metal oxide material. A planarization process such as a CMP process may be performed following the deposition process 640 to planarize the upper surface of the layer 650.

Figures 13, 14:
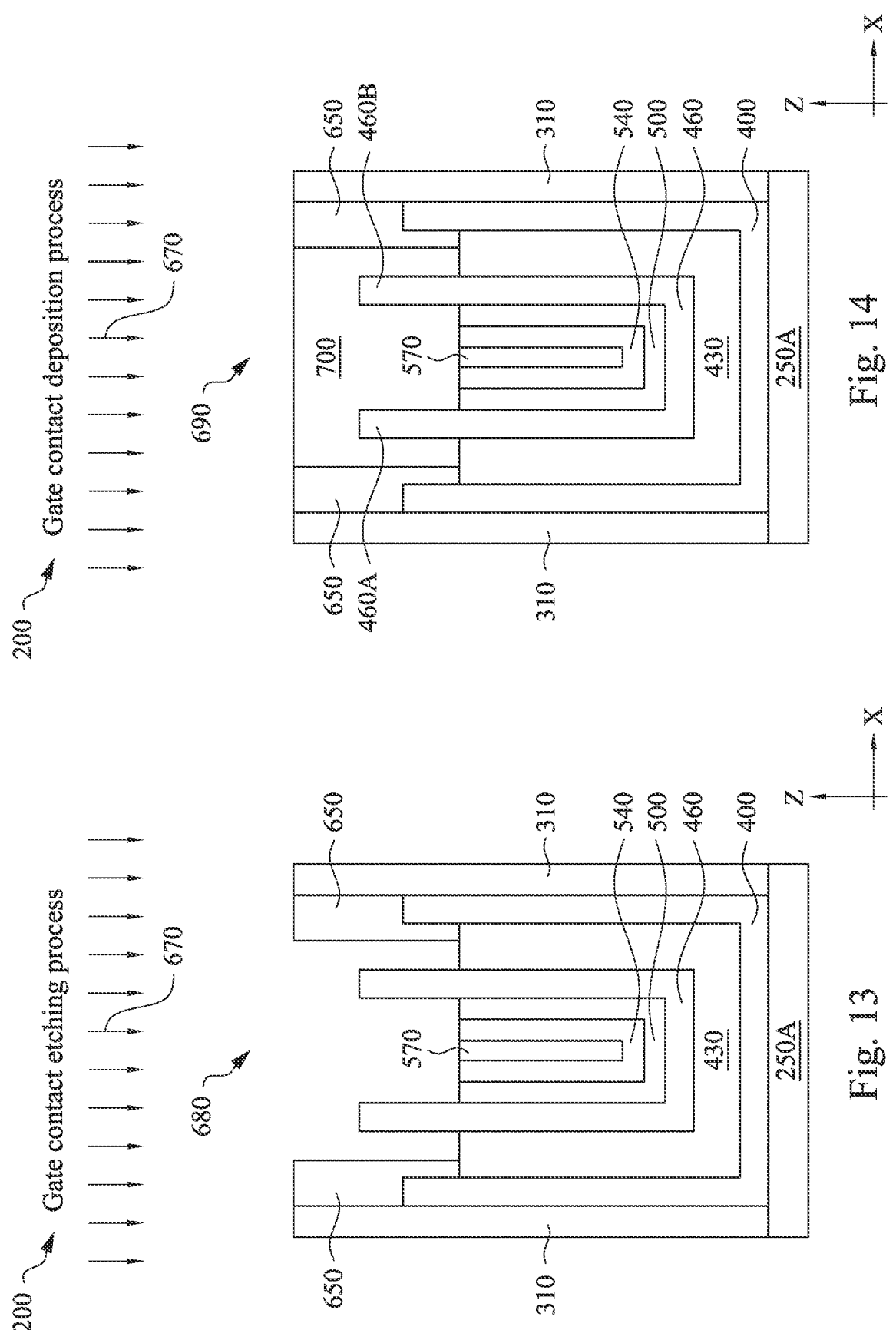

Referring now to FIG. 13, a gate contact etching process 670 is performed to the semiconductor device 200 to partially remove the layer 650, thereby forming an opening 680 in place of the removed portion of the layer 650. The gate contact etching process 670 may include one or more lithography processes that form a patterned photo mask (or a patterned hard mask formed using the patterned photo mask) that defines the location and size of the opening 680. At this stage of fabrication, the upper surfaces of the metal layers 430, 460, 500, 540, and 570 are exposed by the opening 680. The side surfaces of the metal layer 460 are also partially exposed by the opening 680.

Referring now to FIG. 14, a gate contact deposition process 690 is performed to the semiconductor device 200 to form a conductive gate contact 700 in the opening 680. In some embodiments, the gate contact deposition process 690 deposits one or more metal materials or alloys thereof as the conductive gate contact 700. The conductive gate contact 700 provides electrical connectivity to the metal gate electrode (e.g., including the metal layers 430, 460, 500, 540, and 570).

As discussed above, one of the unique physical characteristics of the present disclosure is the "U"-like cross-sectional profile defined by the fill-metal layer 460. Such a profile is achieved as a result of the fill-metal layer 460 being formed earlier in the fabrication process flow of the present disclosure than in conventional devices. For example, whereas conventional devices may form a fill-metal layer after all the work function metal layers have been formed, the present disclosure forms the fill-metal layer 460 after the formation of the work function metal layer 430, but before the formation of the work function metal layers 500, 540, and 570. Consequently, the work function metal layers 500, 540, and 570 are formed within the concave recess defined by the fill-metal layer 460.

Also as shown in FIG. 14, side portions 460A and 460B of the fill-metal layer 460 protrude vertically above the work function metal layers 430, 500, 540, and 570. In other words, the uppermost surface of the fill-metal layer 460 is located above (in the Z-direction) the uppermost surfaces of the work function metal layers 430, 500, 540, and 570. The conductive gate contact 700 is in physical contact with the multiple side portions 460A and 460B, rather than with just one protruding portion of the fill-metal layer in conventional devices. As a result of the greater surface contact area (e.g., with both the side portions 460A and 460B herein v.s. a single portion of the fill-metal layer in conventional devices), the gate structure of the present disclosure offers reduced contact resistance, which helps improve device performance.

Figure 15:
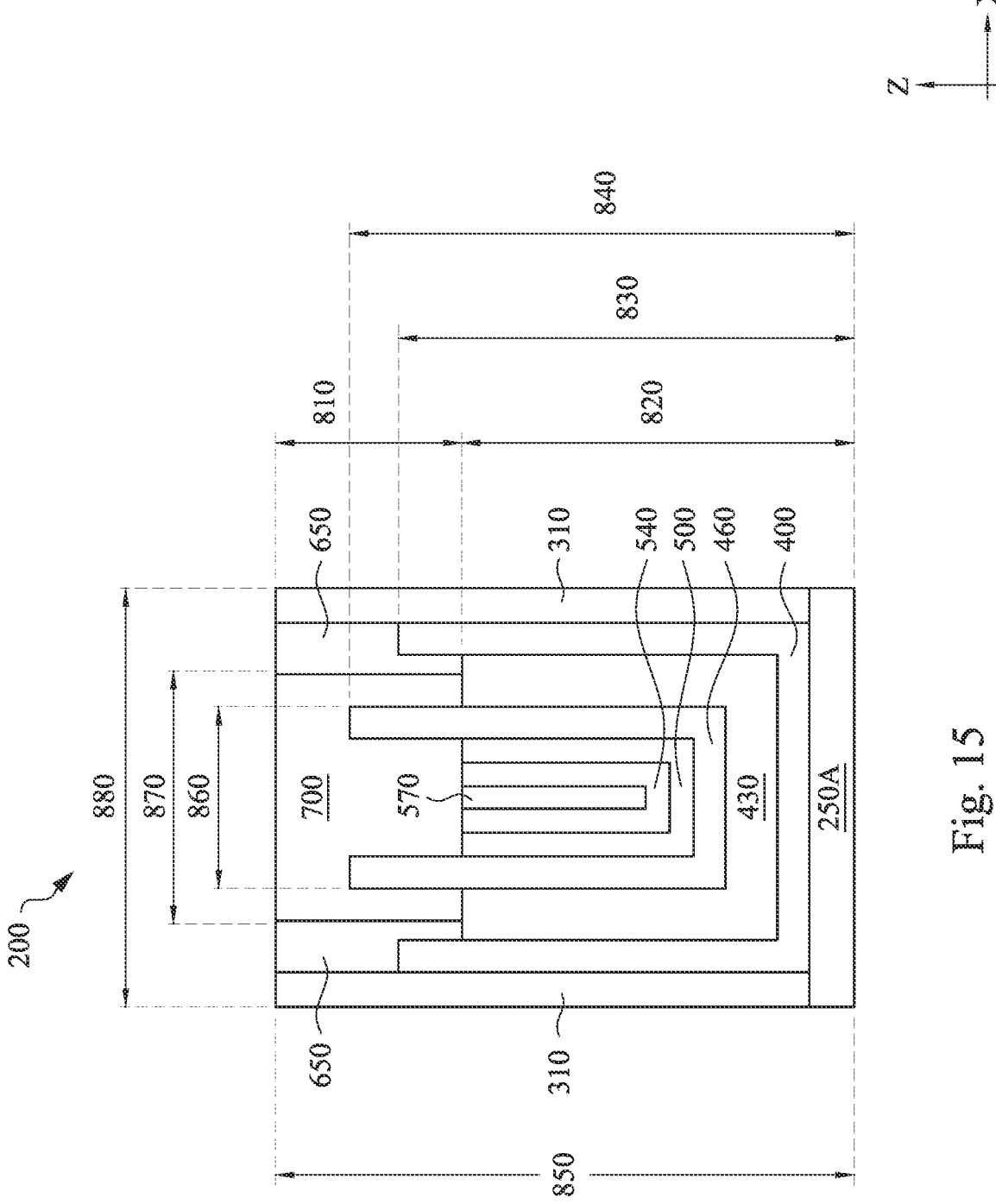

FIG. 15 illustrates the dimensions of various layers of the semiconductor device 200. For example, the conductive gate contact 700 has a vertical dimension or height 810 that is measured from its topmost surface to its bottommost surface in the Z-direction. The metal layer 430 has a vertical dimension or height 820 that is measured from its topmost surface to a bottommost surface of the one or more layers 400 in the Z-direction. The one or more layers 400 has a vertical dimension or height 830 that is measured from its topmost surface to its bottommost surface in the Z-direction. The metal layer 460 has a vertical dimension or height 840 that is measured from its topmost surface to a bottommost surface of the one or more layers 400 in the Z-direction. The gate spacer 310 has a vertical dimension or height 850 that is measured from its topmost surface to its bottommost surface in the Z-direction. According to embodiments of the present disclosure, the height 850>the height 840>=the height 830>the height 820>the height 810. Alternatively stated, the gate spacers 310 and the layer 650 each have more elevated upper surfaces (e.g., more elevated in the Z-direction) than the fill-metal layer 460, and the fill-metal layer 460 has more elevated upper surfaces than the metal layers 430, 500, 540, and 570. The relative heights of the various layers herein allow the fill-metal layer 460 to protrude vertically into the conductive gate contact 700, which as discussed above helps reduce gate contact resistance.

Meanwhile, the metal layer 460 has a lateral dimension or width 860 that is measured from its "leftmost" surface to its "rightmost" surface in the X-direction. The conductive gate contact 700 has a lateral dimension or width 870 that is measured from its "leftmost" surface to its "rightmost" surface in the X-direction. The one or more layers 400 has a lateral dimension or width 880 that is measured from its "leftmost" surface to its "rightmost" surface in the X-direction. According to embodiments of the present disclosure, the width 880>the width 870>=the width 860. The relative widths of the various layers herein are a natural result of the performance of fabrication processes herein.

Figure 16:
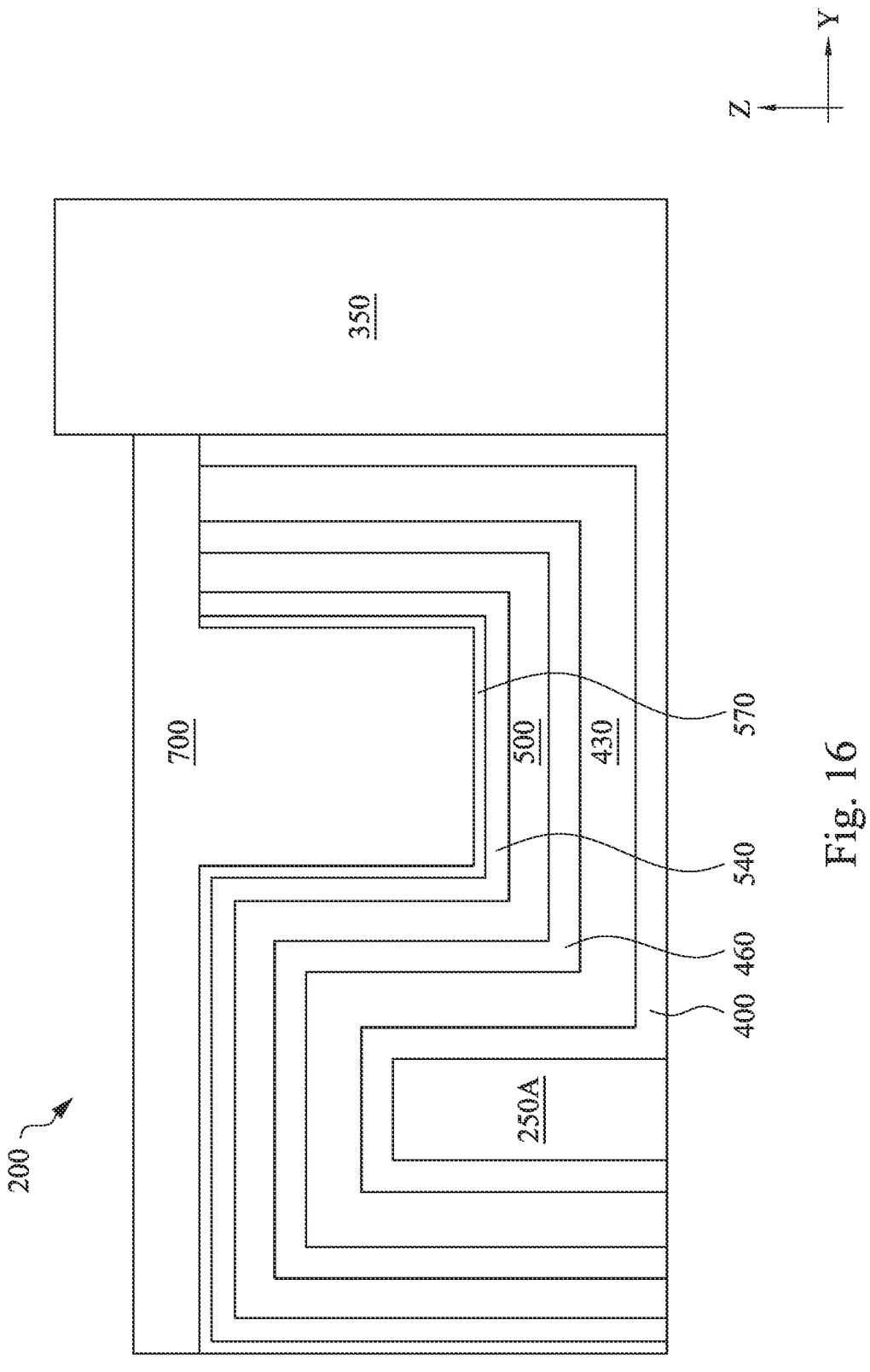

Whereas FIG. 15 illustrates a cross-sectional view of the semiconductor device 200 at an X-Z plane (e.g., a plane cut along A-A' as shown in FIG. 4), FIG. 16 illustrates a cross-sectional view of the semiconductor device 200 at a Y-Z plane (e.g., a plane cut along B-B' as shown in FIG. 4). As shown in FIG. 16, the channel region 250A of the fin structure 250 protrudes vertically upward in the Z-direction, and the various layers 400, 430, 460, 500, 540, and 570 are formed over and wrap around the fin structure 250. The conductive gate contact 700 is formed over the metal layer 570. Again, the one or more layers 400 may serve as the IL and the gate dielectric of the gate structure, and the metal layers 430, 460, 500, 540, and 570 may collectively serve as the metal gate electrode of the gate structure.

Figure 17:
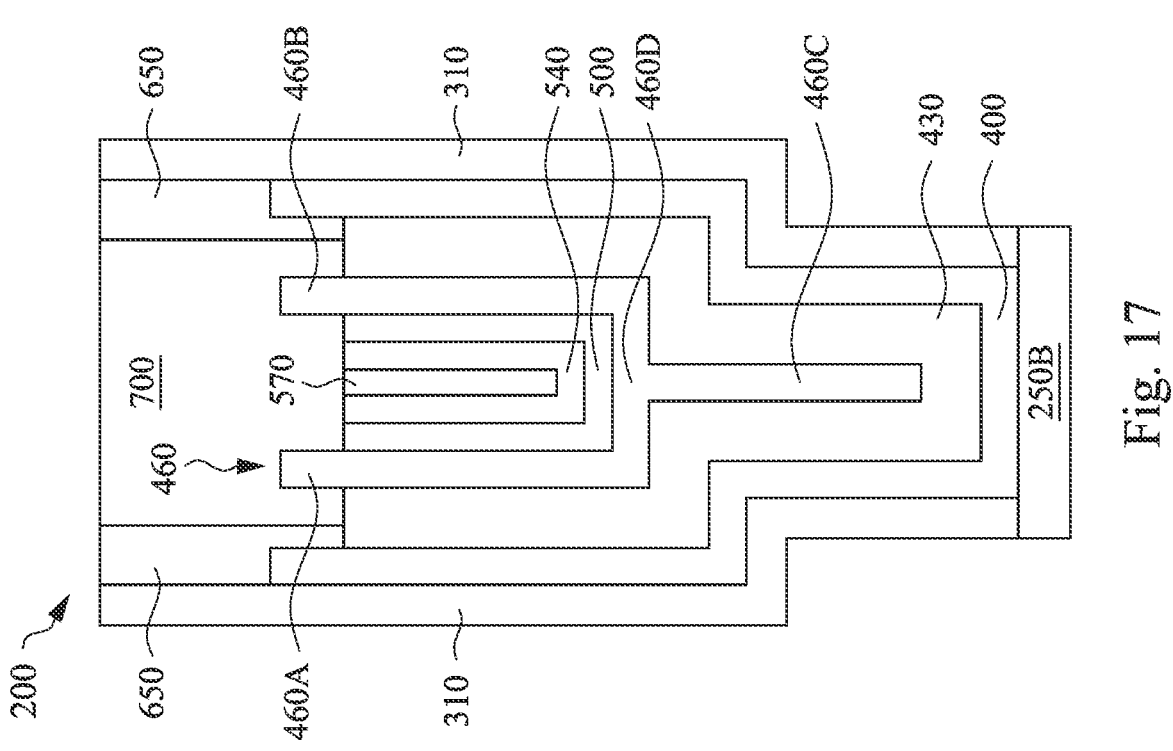

Whereas FIGS. 14-16 illustrate "long channel" embodiments of the semiconductor device 200, FIG. 17 illustrates a "short channel" embodiment of the semiconductor device 200. For the "short channel" embodiment, the semiconductor device 200 has a shortened channel 250B in the X-direction compared to the "long channel" embodiment. Due to the shortened channel 250B, the gate spacers 310 are formed to have a "top wide and bottom narrow" profile, meaning that the opening it defines is wider at the top and narrower at the bottom. The one or more layer 400 and the metal layer 430 are formed subsequently to partially fill such the opening, but the "top wide and bottom narrow" profile is mostly preserved. When the fill-metal layer 460 is formed in the opening, the narrow bottom portion of the opening causes the fill-metal layer 460 to substantially fill the bottom portion of the opening, but not the top. As a result, a bottom portion 460C of the fill-metal layer 460 has an "I"-shape. In other words, the bottom portion 460C is shaped similar to a vertically protruding bar.

Meanwhile, the top portion of the fill metal layer 460 is shaped as a letter "U", where the vertically extending segments 460A and 460B are joined together by a horizontally extending segment 460D. Alternatively stated, the fill metal layer 460 is shaped similar to a fork, or a goal post in American football. The top portion of the fill-metal layer 460—comprising the segments 460A, 460B, and 460D—define an opening in which the metal layers 500, 540, and 570 are formed. The "short channel" embodiment shown in FIG. 17 still achieves a reduced gate contact resistance, since the top portion of the fill-metal layer 460 still has multiple "fingers" (e.g., the segments 460A-460B) that are in physical contact with the conductive gate contact 700.

FIG. 18 is a flowchart illustrating a method 900 of fabricating a semiconductor device according to another embodiment of the present disclosure. The method 900 includes a step 910 of forming a gate dielectric layer.

The method 900 includes a step 920 of depositing a first work function metal layer over the gate dielectric layer.

The method 900 includes a step 930 of depositing a fill-metal layer over the first work function metal layer. The fill-metal layer defines a concave recess.

The method 900 includes a step 940 of depositing a second work function metal layer in the concave recess.

The method 900 includes a step 950 of forming a dielectric material over the first work function metal layer, the fill-metal layer, and the second work function metal layer.

The method 900 includes a step 960 of etching an opening through the dielectric material. The opening exposes upper surfaces and side surfaces of a plurality of segments of the fill-metal layer.

The method 900 includes a step 970 of filling the opening with a conductive gate contact. The plurality of segments of the fill-metal layer protrudes vertically into the conductive gate contact.

In some embodiments, the depositing the first work function metal layer and the depositing the second work function metal layer comprise: depositing a p-type work function metal layer as the first work function metal layer and depositing an n-type work function metal layer as the second work function metal layer; or depositing an n-type work function metal layer as the first work function metal layer and depositing a p-type work function metal layer as the second work function metal layer.

In some embodiments, the depositing the fill-metal layer is performed such that at least a portion of the fill-metal layer has a U-shaped cross-sectional profile.

It is understood that additional steps may still be performed before, during, or after the steps 910-970 discussed above. For example, the method 900 may include the following steps: after the depositing the second work function metal layer and before the forming the dielectric material: etching the first work function metal layer, the fill-metal layer, and the second work function metal layer, wherein the fill-metal layer is etched at a slower etching rate than the first work function metal layer and the second work function metal layer, thereby causing the plurality of segments of the fill-metal layer to protrude above the first work function metal layer and the second work function metal layer. As another example, the method 900 may include the following steps: depositing a third work function metal layer over the fill-metal layer, wherein the second work function metal layer is deposited over the third work function metal layer; and depositing a fourth work function metal layer over the second work function metal layer; wherein the second work function metal layer and the third work function metal layer partially fill the concave recess defined by the fill-metal layer, and wherein the fourth work function metal layer completely fills the concave recess defined by the fill-metal layer. As yet another example, the method 900 may include the following steps: before the forming the gate dielectric layer: forming a fin structure that contains a semiconductive material; forming a dummy gate structure that wraps around the fin structure, wherein the dummy gate structure includes a dummy gate electrode and gate spacers formed on sidewalls of the dummy gate electrode; and removing the dummy gate electrode, thereby forming a trench defined at least in part by the gate spacers, wherein the gate dielectric layer is formed to partially fill the trench.

Based on the above discussions, the present disclosure introduces a novel scheme of metal gate electrode formation. Rather than forming all the work function metal layers before the fill-metal layer, the present disclosure forms the work function metal layer before at least some of the work function metal layers. As a result of the novel fabrication scheme, the fill-metal layer of the present disclosure has a "U-shaped" cross-sectional profile. For example, the fill-metal layer may have multiple vertically protruding "fingers" that protrude into the conductive gate contact.

The gate electrode of the present disclosure offers advantages over conventional gate electrodes. However, it is understood that not all advantages are discussed herein, different embodiments may offer different advantages, and that no particular advantage is required for any embodiment. One advantage is improved performance. For example, the multiple vertically protruding fingers of the fill-metal herein effectively increase the surface contact area between the gate electrode and the conductive gate contact, which in turns reduces gate contact resistance. Hence, device performance is improved due to the reduced gate contact resistance. Another advantage is the improved gap-filling performance of the fill-metal. For example, conventional gate electrode formation processes typically form the fill-metal after all the work function metal layers have been formed. At that point, the trench to be filled by the fill-metal may be quite narrow, and therefore the fill-metal needs to have good gap-filling characteristics in order to fill the trench without creating large gaps or air bubbles therein. In contrast, since the present disclosure forms the fill-metal before at least some of the work function metal layers, the trench to be filled by the fill-metal herein is substantially wider than in conventional devices. Hence, the fill-metal herein need not have as strict/stringent requirements with respect to its gap-filling characteristics. The resulting device is also less likely to have air bubbles or gaps trapped in the metal gate electrode, which improves the device yield. In addition, since gap-filling is no longer a strict requirement for the fill-metal layer, material other than tungsten (W) may be used to implement the fill-metal, for example Cu, Co, or Al may all be suitable candidates for implementing the fill-metal layer herein. Other advantages may include compatibility with existing fabrication processes and the ease and low cost of implementation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure pertains to a semiconductor device. The semiconductor device includes a channel component of a transistor and a gate component disposed over the channel component. The gate component includes: a dielectric layer; a first work function metal layer disposed over the dielectric layer; a fill-metal layer disposed over the first work function metal layer; and a second work function metal layer disposed over the fill-metal layer.

Another aspect of the present disclosure pertains to a gate structure of a transistor. The gate structure includes: a gate dielectric layer; a first work function metal layer located over the gate dielectric layer; a fill-metal layer located over the first work function metal layer, wherein the fill-metal layer includes a U-shaped recess; and a second work function metal layer in the U-shaped recess. The fill-metal layer has more elevated upper surfaces than the first work function metal layer and the second work function metal layer.

Yet another aspect of the present disclosure pertains to a method of fabricating a semiconductor device. The method includes: forming a gate dielectric layer; depositing a first work function metal layer over the gate dielectric layer; depositing a fill-metal layer over the first work function metal layer, wherein the fill-metal layer defines a concave recess; depositing a second work function metal layer in the concave recess; forming a dielectric material over the first work function metal layer, the fill-metal layer, and the second work function metal layer; etching an opening through the dielectric material, wherein the opening exposes upper surfaces and side surfaces of a plurality of segments of the fill-metal layer; and filling the opening with a conductive gate contact, wherein the plurality of segments of the fill-metal layer protrudes vertically into the conductive gate contact.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate dielectric layer that defines an opening in a cross-sectional view;
   depositing a first work function metal layer over the gate dielectric layer, the first work function metal layer partially filling the opening;
   depositing a fill-metal layer over the first work function metal layer, wherein the fill-metal layer partially filling the opening;
   depositing one or more second work function metal layers over the fill-metal layer, the one or more second work function metal layers completely filling the opening;
   performing an etching process, wherein the etching process etches the first work function metal layer and the one or more second work function metal layers at a faster rate than the fill-metal layer, wherein the fill-metal layer has a more vertically elevated upper surface than the first work function metal layer and the one or more second work function metal layers after the etching process has been performed; and
   forming a conductive contact over the fill-metal layer, the first work function metal layer, and the one or more second work function metal layers.

2. The method of claim 1, wherein at least two different second work function metal layers are deposited.

3. The method of claim 2, wherein one of the two different second work function metal layers includes a p-type work function metal, and wherein another one of the two different second work function metal layers includes an n-type work function metal.

4. The method of claim 2, wherein at least three second work function metal layers are deposited.

5. The method of claim 1, wherein the fill-metal layer has a more vertically elevated upper surface than the gate dielectric layer after the etching process has been performed.

6. The method of claim 1, wherein the conductive contact is formed to wrap around an upper surface and side surfaces of the fill-metal layer.

7. The method of claim 6, wherein the conduct contact is formed over upper surfaces of the first work function metal layer and the one or more second work function metal layers, but is free from coming into direct contact with side surfaces of the first work function metal layer and the one or more second work function metal layers.

8. The method of claim 1, further comprising, before the forming the conductive contact:
   forming a dielectric layer over the fill-metal layer, the first work function metal layer, and the one or more second work function metal layers; and
   partially removing the dielectric layer, thereby forming a recess that exposes portions of the fill-metal layer, the first work function metal layer, and the one or more second work function metal layers, wherein the conductive contact is formed in the recess.

9. The method of claim 8, wherein after the dielectric layer has been partially removed, portions of the dielectric layer remain on the first work function metal layer, but not on the fill-metal layer or the one or more second work function metal layers.

10. The method of claim 8, wherein the dielectric layer includes silicon nitride, silicon carbide, silicon oxycarbon nitride, or a metal oxide.

11. The method of claim 1, wherein the etching process etches the gate dielectric layer at a faster etching rate than the fill-metal layer, but at a slower etching rate than the first work function metal layer and the one or more second work function metal layers.

12. A method, comprising:
   providing a structure that includes a gate dielectric layer formed over a channel, wherein the gate dielectric layer defines an opening in a cross-sectional view;
   partially filling the opening with a first work function metal layer and a fill-metal layer of a gate electrode, wherein the fill-metal layer is formed over the first work function metal layer;
   completely filling the opening with one or more second work function metal layers of the gate electrode;
   performing an etching process, wherein the etching process etches the first work function metal layer and the one or more second work function metal layers at a faster rate than the fill-metal layer, such that the fill-metal layer protrudes vertically over the first work function metal layer and the one or more second work function metal layers after the etching process has been performed; and
   forming a conductive contact over the fill-metal layer, the first work function metal layer, and the one or more second work function metal layers.

13. The method of claim 12, wherein the completely filling the opening comprises filling the opening with multiple second work function metal layers.

14. The method of claim 12, wherein:
   the partially filling the opening comprises depositing a p-type work function metal layer as the first work function metal layer; and
   the completely filling the opening comprises depositing an n-type work function metal layer as one of the second work function metal layers.

15. The method of claim 12, wherein:
   the partially filling the opening comprises depositing an n-type work function metal layer as the first work function metal layer; and
   the completely filling the opening comprises depositing a p-type work function metal layer as one of the second work function metal layers.

16. The method of claim 12, further comprising, after the etching process has been performed but before the conductive contact has been formed:

forming a dielectric material over the fill-metal layer, the first work function metal layer, and the one or more second work function metal layers; and etching a gate contact opening in the dielectric material, wherein the conductive contact is formed by filling the gate contact opening with a conductive material.

17. The method of claim 12, wherein the etching process etches the gate dielectric layer at a faster etching rate than the fill-metal layer, but at a slower etching rate than the first work function metal layer and the one or more second work function metal layers.

18. A method, comprising:

forming a first work function metal layer in a recess defined by a gate dielectric layer;

forming a fill-metal layer over the first work function metal layer, wherein the fill-metal layer partially fills the recess;

forming a second work function metal layer over the fill-metal layer;

forming a third work function metal layer over the fill-metal layer, wherein the first work function metal layer is formed to have a different type of conductivity than the second work function metal layer or the third work function metal layer; and forming a conductive contact over the third work function metal layer.

19. The method of claim 18, further comprising, before the conductive contact is formed:

performing a first etching process, wherein the fill-metal layer has a greater height than the first work function metal layer, the second work function metal layer, and the third work function metal layer after the first etching process has been performed;

forming a dielectric material over the fill-metal layer, the first work function metal layer, the second work function metal layer, and the third work function metal layer; and performing a second etching process that forms an opening in the dielectric material, the opening exposing upper and side surfaces of the fill-metal layer, wherein the conductive contact is formed at least in part by filling the opening with a conductive material.

20. The method of claim 19, wherein the first etching process etches at least one of the first work function metal layer, the second work function metal layer, or the third work function metal layer at a faster rate than the fill-metal layer.

* * * * *